US006857433B2

(12) United States Patent
Henderson et al.

(10) Patent No.: US 6,857,433 B2
(45) Date of Patent: Feb. 22, 2005

(54) PROCESS FOR CLEANING A GLASS-COATING REACTOR USING A REACTIVE GAS

(75) Inventors: Philip Bruce Henderson, Allentown, PA (US); Mario Joseph Moniz, Emmaus, PA (US); Andrew David Johnson, Doylestown, PA (US); Eugene Joseph Karwacki, Jr., Orefield, PA (US); Richard R. Bodette, Kingsport, TN (US); Christopher Robert Cording, Kingsport, TN (US); Herbert David Johnson, Kingsport, TN (US)

(73) Assignee: Air Products and Chemicals, Inc., Allentown, PA (US)

( * ) Notice: Subject to any disclaimer, the term of this patent is extended or adjusted under 35 U.S.C. 154(b) by 162 days.

(21) Appl. No.: 10/201,354

(22) Filed: Jul. 22, 2002

(65) Prior Publication Data

US 2004/0011385 A1 Jan. 22, 2004

(51) Int. Cl.$^7$ ................................................. B08B 3/08
(52) U.S. Cl. ....................... 134/1.1; 438/905; 427/534; 427/535
(58) Field of Search ................... 427/534, 535, 427/569, 533; 134/1.1; 438/905

(56) References Cited

U.S. PATENT DOCUMENTS

| | | | |
|---|---|---|---|
| 5,413,670 A | | 5/1995 | Langan et al. |
| 5,632,821 A | * | 5/1997 | Doi ............................ 134/1.1 |
| 5,679,215 A | * | 10/1997 | Barnes et al. ................. 134/1.1 |
| 5,861,065 A | | 1/1999 | Johnson |
| 5,868,852 A | * | 2/1999 | Johnson et al. .............. 134/1.1 |
| 6,164,295 A | | 12/2000 | Ui et al. |
| 6,383,300 B1 | | 5/2002 | Saito et al. |
| 6,537,461 B1 | * | 3/2003 | Nakahara et al. ............. 216/67 |
| 6,647,993 B2 | * | 11/2003 | Shang et al. ................. 134/1.1 |
| 6,659,111 B1 | * | 12/2003 | Mouri et al. ................ 134/22.1 |

FOREIGN PATENT DOCUMENTS

| | | |
|---|---|---|
| EP | 0 636 707 A2 | 2/1995 |
| EP | 0 774 778 A2 | 5/1997 |

OTHER PUBLICATIONS

A.D. Johnson, et al, "Reducing PFC Gas Emissions From . . . ", Sol. State Technol., p. 103 (1999).
S. Raoux, et al, "Remote Microwave Plasma Source For . . . ", J. Vac. Sci. Technol., 17(2), p. 477 (1999).
R. Kalbskopf, "Continuous Chemical Vapor Deposition . . . ", Thin Sol. Films, 77, p. 65–66, (1981).
H.K. Pulker, "Coatings on Glass", Elsevier, Amsterdam, p. 213, (1984).

* cited by examiner

Primary Examiner—Bret Chen
(74) Attorney, Agent, or Firm—Robert J. Wolff

(57) ABSTRACT

A process for cleaning a glass-coating reactor includes: (a) providing the reactor to be cleaned, wherein the reactor contains a glass substrate within a chamber and the chamber has an internal surface coated with at least one substance selected from the group consisting of $Si_3N_4$ or $SiO_2$; (b) terminating a flow of a deposition gas to the reactor; (c) adding to the reactor at least one cleaning gas to react with the at least one substance to form at least one volatile product; and (d) removing from the reactor the at least one volatile product.

25 Claims, No Drawings

PROCESS FOR CLEANING A GLASS-COATING REACTOR USING A REACTIVE GAS

BACKGROUND OF THE INVENTION

This invention relates to processes for cleaning glass-coating reactors, and more particularly to a process for cleaning such reactors with a reactive gas.

Two commonly used methods to apply coatings to flat glass substrates are Atmospheric Pressure Chemical Vapor Deposition (APCVD) and vacuum sputtering. In APCVD, gaseous or vapor coating reagents are carried to the heated glass surface by a flow of gas. The reagents react on the surface of the hot glass to form a thin coating. For example, silane ($SiH_4$) and carbon dioxide ($CO_2$) are delivered to a heated glass surface to make a thin silicon dioxide ($SiO_2$) coating. An APCVD reactor can be integrated directly into the float-glass tin bath process for the manufacture of the coated flat glass substrate. One drawback is that the $SiO_2$ product not only grows on the hot glass substrate surface, but also on the hot walls of the reactor. It also nucleates in the gas phase and deposits loose particles in the exhaust system. Eventually, debris from the deposits on the wall and in the exhaust system will shed particles on the manufactured glass making it an unacceptable product. This unwanted deposited material on the reactor walls and in the exhaust system must be removed periodically in order to make an acceptable quality coated glass product.

In vacuum sputtering, preformed flat glass sheets are passed into an evacuated chamber. A plasma (glow discharge) is formed from a plasma-producing gas such as argon, helium, etc., introduced into the evacuated system. The ions in the plasma are accelerated at a cathode "target" made from the substance that is to be deposited on the glass surface. The impact of the plasma ion dislodges material from the target. The dislodged material deposits on the glass surface, forming a thin coating. In reactive sputtering, a reactive gas chemically combines with the dislodged material from the target to form a new chemical species that deposits on the glass surface. For example, using a silicon (Si) target in a reactive nitrogen or oxygen atmosphere, silicon nitride ($Si_3N_4$) or silicon oxide ($SiO_2$) is deposited on the glass surface. As with APCVD, the formed $Si_3N_4$ or $SiO_2$ also deposits on the walls of the reactor as well as the sides of the Si target. This coating on the walls and target eventually interferes with the sputtering process and must be removed.

Current practice by the glass coating industry is to clean either the APCVD or sputtering reactor by taking the reactor offline and mechanically removing (scraping or abrading) the wall coating. This results in costly reactor down time.

In the APCVD case, the reactor walls are sprayed with nitrogen and scraped with special tools that withstand the high reactor temperature. Since the glass production line cannot be stopped during the cleaning operation, the scraped debris falls onto the surface of the glass and produces unwanted defects on the surface. This unacceptable product must be re-melted or thrown away. After a moderate number of cycles, manual cleaning is no longer effective and the reactor must be taken completely out of the process, cooled and rebuilt.

In the sputter case, the reactor must be taken completely offline, pressurized to ambient, opened up and mechanically cleaned. Although the actual mechanical cleaning does not take a large amount of time or labor, reassembling and evacuating the sputter reactor takes several hours. The literature does not teach any other method for cleaning these glass-coating reactors.

A known method for removing unwanted deposits in a chemical vapor deposition (CVD) reactor used for semiconductor manufacturing is to introduce a reactive gas into the reactor to etch away the unwanted deposits.

An example of CVD chamber etching using a plasma etch process follows $SiO_2$ deposition on a semiconductor substrate in a plasma enhanced CVD (PECVD) reactor. See, e.g., Johnson et al., "Reducing PFC Gas Emissions From CVD Chamber Cleaning," Solid State Technology, p.103 (December 1999). After the thin film deposition, the wafer is removed and the debris in the chamber is etched using a $C_2F_6/O_2$-based or $NF_3$-based plasma process or a remote $NF_3$-based process. The fluorine source for in situ plasma etching is typically $C_2F_6$. However, $NF_3$-based plasma etching processes have also been developed. See U.S. Pat. No. 5,413,670 to Langan et al. $NF_3$ plasmas may be generated in situ or using a remote plasma source. See, e.g., Raoux et al., "Remote Microwave Plasma Source for Cleaning Chemical Vapor Deposition Chambers: Technology for Reducing Global Warming Gas Emissions," J. Vac. Sci. Technol., 17(2), p.477, March/April 1999.

An example of CVD reactor debris removal using a thermal etch process follows $SiN_x$ deposition on a semiconductor substrate in a low pressure CVD (LPCVD) furnace. See, e.g., U.S. Pat. No. 5,868,852 to Johnson et al. and U.S. Pat. No. 5,861,065 to Johnson. LPCVD furnaces are batch reactors where about 100 wafers are processed simultaneously. After the deposition, the wafers are removed, and because the LPCVD furnaces operate at 500–800° C., the debris on the walls can be etched by introducing $NF_3$ gas into the reactor at temperature (i.e., no plasma is required). Thermal etching can only be accomplished using fluorine compounds that decompose at the operating temperature of the furnace.

Accordingly, it is desired to provide a process for cleaning a glass-coating reactor using a reactive gas.

It is further desired to clean such a reactor without employing scraping tools.

It is still further desired to clean such a reactor without taking it offline or significantly reducing the temperature in the reactor.

All references cited herein are incorporated herein by reference in their entireties.

BRIEF SUMMARY OF THE INVENTION

Accordingly, the invention provides a process for cleaning a glass-coating reactor comprising: (a) providing the reactor to be cleaned, wherein the reactor contains a chamber having an internal surface coated with at least one substance selected from the group consisting of $Si_3N_4$ or $SiO_2$; (b) substantially terminating a flow of a deposition gas to the reactor; (c) adding to the reactor at least one cleaning gas to react with the at least one substance to form at least one volatile product; and (d) removing from the reactor the at least one volatile product to clean the reactor.

DETAILED DESCRIPTION OF THE INVENTION

The inventors are not aware of any prior use of a reactive gas to clean the unwanted deposits from a glass coating APCVD or sputtering reactor. Although there are examples of cleaning APCVD reactors that coat semiconductor substrates in the electronics industry (as discussed above) the inventors are not aware of any examples of inline cleaning of sputter reactors. In the previously known APCVD cases, the substrate is removed prior to cleaning. In the preferred mode of the present invention, the substrate (e.g., float-line glass) is not removed during cleaning. It is surprising that the inventors were able to identify conditions where cleaning is still observed, but the glass substrate retains a high transparency and can be sold as clear, uncoated glass or used for other applications.

The primary advantages of the invention over mechanically cleaning the reactors are a simplified, less labor-intensive cleaning operation and a vastly shortened time to bring the reactor back to normal operating conditions after cleaning. With on-line APCVD coaters, an additional advantage is that the glass produced during the cleaning remains clear and can be sold as clear, uncoated glass, unlike glass from mechanically cleaned reactors, which need to be recycled or treated as waste. While the reactors cannot make coated product while the reactive gas is cleaning the reactor in accordance with the present invention, the reactors can remain at their normal operating conditions (pressure and temperature) during the cleaning operation. Sputter reactors, which operate at millitorr pressures, take several hours to return to base pressure after being opened for the current manual cleaning operation. With the inline cleaning method of the invention, sputter reactors can be placed back into coating service in a few minutes after cleaning.

The processes for cleaning APCVD and sputter reactor debris from glass coating processes while similar do operate on different principles with a different list of preferred reactive cleaning gases.

The integrated APCVD glass coating process has been described previously. See, e.g., Kalbskopf, Thin Solid Films, 77, 65, (1981). When a reactor-cleaning step is required, the flow of deposition gas is stopped and purged from the reactor and delivery lines. If needed, the temperature of the reactor temperature may be changed to an optimum value; however in the preferred mode the reactor temperature is maintained at the coating process conditions. A flow of one or more of the APCVD cleaning gases, with an inert diluent, is flowed into the reactor. The cleaning gas converts the debris on the reactor surfaces made from the deposition gas into volatile compounds that are swept from the reactor. After a prescribed time or after the concentration of the formed volatile compounds detected in the reactor effluent is below an acceptable level, the cleaning gas flow is stopped and preferably purged from the reactor and delivery lines. The flow of the deposition gas is then restarted and the APCVD glass coating process resumed. The rate of reaction of the cleaning gas(es) depends on the concentration of the gas(es) and other operating conditions such as temperature.

Reactive gases useful for the removal of APCVD reactor debris (thermal cleaning) include but are not limited to $NF_3$ (preferred), $F_2$, HF, $ClF_3$, $BrF_3$ or mixtures of these gases. Any of these gases also may be mixed with an inert gas such as $N_2$, Ar or He. Optimally, a concentration of these gases is used so that the reactive cleaning gas does not affect the transparency of the glass. For example, $NF_3$ can be employed at a concentration of 2–10% (all percentages referred to herein are in volume percent unless otherwise indicated), which is much lower than is typically used in the prior art semiconductor substrate reactors for the electronics industry.

In this way the glass produced during the cleaning step can still be sold as uncoated clear glass. This avoids the expensive recycling of the off-spec glass produced in the conventional mechanical cleaning process.

The sputter process for coating formed flat glass substrates has been described previously. Pulker, Coatings on Glass, Elsevier, Amsterdam, 1984, p. 213. When a reactor cleaning step is required, flow of the source gas for the plasma is preferably stopped and a flow of one or more of the sputter cleaning gases is flowed into the reactor. A plasma of the cleaning gas creates reactive ionic and neutral species that converts the wall debris made from the sputter target into volatile compounds that are evacuated from the reactor. After a prescribed time or after none of the formed volatile compounds are detected in the reactor effluent, the cleaning gas flow is stopped and purged from the delivery lines. The flow of the source gas for the plasma is restarted and the sputtering process is resumed.

Reactive gases useful for the removal of sputter reactor debris (plasma-assisted cleaning) include $NF_3$ (preferred), $F_2$, HF, $CHF_3$, and gaseous perfluorocarbons ($C_xF_y$), particularly gaseous $C_1$–$C_4$ perfluorocarbons such as $CF_4$, $C_2F_6$, $C_3F_8$, and cyclo-$C_4F_8$). The perfluorocarbon gases are preferably diluted with 40–80% $O_2$. Any of these reactive gases may be diluted with an inert gas such as $N_2$, Ar, or He.

An alternative method for cleaning the sputter reactor is to use as the cleaning gas the effluent from plasma generated in a smaller reactor remote to the sputter reactor. A gas mixture, typically $NF_3$ and argon but optionally including a perfluorocarbon as described above, is introduced into the remote chamber where a microwave or RF plasma is sustained. The effluent from this remote chamber, containing mostly reactive fluorine atoms and inert species, is introduced into the sputter reactor where the reactive fluorine atoms convert the wall debris into volatile compounds that are evacuated from the reactor. After a prescribed time or after the concentration of the formed volatile compounds detected in the reactor effluent is below an acceptable level, the source gas to the remote plasma chamber is stopped. The flow of the source gas for the sputtering plasma is restarted and the sputtering process is resumed.

Optimum cleaning conditions are process dependent but can include, e.g., using concentration variations of the reactive cleaning gas or using multiple cleaning gases together or stepwise. Moreover, optimum cleaning gas concentrations and reactor residence times can require that a portion of the cleaning gas pass through the system unreacted. In this case, the cleaning gas could be removed from the exhaust stream and recycled. While any suitable temperature may be chosen for cleaning, one advantage of the current invention is that the chamber is cleaned at temperatures that are similar to the deposition temperature. In certain embodiments, the cleaning temperature is within 10° C., preferably within 5° C. of a deposition temperature of the reactor. Similarly, while the pressure of the reactor during cleaning can be maintained at any suitable pressure, it may be kept close to the pressure during deposition (preferably within about 10 Torr, more preferably within 1 Torr). This allows the reactor to be maintained at operating conditions and for the production of glass during the cleaning process.

The cleaning times for all of these operations can be optimized or controlled by the detection of the formed volatile species in the effluent of the reactor to be cleaned. Preferably, the analysis is performed by Fourier Transform Infrared Spectroscopy or Mass Spectrometry. The volatile product from the reactor can be, e.g., vented, adsorbed, decomposed in a scrubber or separated and recovered.

Before adding the cleaning gas to the reactor, it is preferable to substantially terminate the flow of the deposition gas to the reactor. The flow is substantially terminated when any remaining flow of deposition gas to the reactor is insufficient to perceptibly hinder the effects of the cleaning gas. In certain embodiments, the flow is substantially terminated when it is at least 90% terminated (i.e., the original flow is reduced by at least 90%). Of course, the term "substantially terminate" encompasses complete termination of the flow of the deposition gas to the reactor.

The invention will be illustrated in more detail with reference to the following Examples, but it should be understood that the present invention is not deemed to be limited thereto.

EXAMPLES

Example 1

A commercial $SiO_2$ APCVD coating apparatus integrated into a float glass manufacturing line of the style described in U.S. Pat. No. 4,828,880 was coated with $SiO_2$ debris after completing a typical campaign of $SiO_2$ deposition on float glass. 0.8 pounds of $NF_3$ was passed through the reactor as 4% $NF_3$ in $N_2$ to remove the $SiO_2$ debris on the reactor walls. The glass produced during the 4% $NF_3$ flow remained transparent. The operating temperature was the same as used during the deposition step.

Example 2

In an externally heated (650° C.) small-scale test reactor set up to simulate the reaction zone of the reactor from the above example was placed a glass substrate and carbon top-piece. The carbon top-piece was coated with $SiO_2$.debris collected from the commercial-scale reactor. Various concentrations of $NF_3$ in $N_2$ were passed through the reactor. Removal of the $SiO_2$ debris was effective in all $NF_3$ concentrations, except at $NF_3$ concentration of at least 10%, reactions with the glass substrate were substantial enough to cause the formation of non-volatile residues in the reactor. The optimum concentration of $NF_3$ will depend on glass temperature and surface composition (presence of hydroxyls).

While the invention has been described in detail and with reference to specific examples thereof, it will be apparent to one skilled in the art that various changes and modifications can be made therein without departing from the spirit and scope thereof.

What is claimed is:

1. A process for cleaning a glass-coating reactor, said process comprising:
   providing the reactor to be cleaned, wherein the reactor contains a chamber having an internal surface coated with at least one substance selected from the group consisting of $Si_3N_4$ or $SiO_2$;
   substantially terminating a flow of a deposition gas to the reactor;
   adding to the reactor at least one cleaning gas to react with the at least one substance to form at least one volatile product; and
   removing from the reactor the at least one volatile product to clean the reactor;
   wherein a glass substrate remains within the chamber throughout the process without being harmed.

2. The process of claim 1, wherein the reactor is purged of the deposition gas prior to adding the at least one cleaning gas.

3. The process of claim 1, wherein the at least one cleaning gas is added to the reactor with an inert diluent.

4. The process of claim 1, wherein the at least one substance coated on the internal surface is deposited by atmospheric pressure chemical vapor deposition, and the at least one cleaning gas is at least one member selected from the group consisting of $NF_3$, $F_2$, HF, $ClF_3$ and $BrF_3$.

5. The process of claim 4, wherein the at least one cleaning gas is $NF_3$.

6. The process of claim 4, wherein the at least one cleaning gas is mixed with an inert gas.

7. The process of claim 1, wherein the at least one substance coated on the internal surface is deposited by vacuum sputtering and the at least one cleaning gas is at least one member selected from the group consisting of $NF_3$, $F_2$, HF, $CHF_3$ and gaseous mixtures of $C_1$–$C_4$ perfluorocarbon and $O_2$.

8. The process of claim 7, wherein the gaseous mixtures comprise 20–60 vol. % $C_1$–$C_4$ perfluorocarbon and 80–40 vol. % $O_2$.

9. The process of claim 7, wherein the at least one cleaning gas is mixed with an inert gas.

10. The process of claim 7, wherein a plasma of the cleaning gas is created to provide reactive ionic and neutral species that react with the at least one substance to form the at least one volatile product.

11. The process of claim 10, wherein the reactive ionic and neutral species also react with additional amounts of the at least one substance coated on a target of the vacuum sputtering.

12. The process of claim 10, wherein the plasma is generated in the reactor.

13. The process of claim 10, wherein the plasma is generated in an auxiliary reactor separate from the reactor.

14. The process of claim 1 wherein the at least one cleaning gas is added to the reactor at a cleaning-effective concentration that is insufficient to affect a transparency of the glass substrate.

15. The process of claim 14, where the cleaning-effective concentration is 2–10 vol. %.

16. The process of claim 1, wherein the at least one cleaning gas is added to the reactor at a concentration of 2–10 vol. %.

17. The process of claim 16, wherein the at least one cleaning gas is at least one member selected from the group consisting of $NF_3$, $F_2$, HF, $CHF_3$, $ClF_3$, $BrF_3$ and gaseous mixtures of 20–60 vol. % $C_1$–$C_4$ perfluorocarbon and 80–40 vol. % $O_2$.

18. The process of claim 16, wherein the at least one cleaning gas is $NF_3$.

19. The process of claim 1, wherein the at least one cleaning gas is added to the reactor until an effluent from the reactor is free of the at least one volatile product.

20. The process of claim 1, wherein a cleaning temperature of the reactor during the process is within 10° C. of a deposition temperature of the reactor.

21. The process of claim 1, wherein a cleaning pressure of the reactor during the process is within 10 Torr of a deposition pressure of the reactor.

22. The process of claim 1, conducted without mechanically removing the at least one substance from the reactor.

23. The process of claim 1, wherein the at least one volatile product is $SiF_4$.

24. The process of claim 1, wherein the flow of the deposition gas to the reactor is completely terminated.

25. The process of claim 1, wherein the flow of the deposition gas to the reactor is 90% terminated.

* * * * *